United States Patent
Hsu

(10) Patent No.: US 8,227,711 B2
(45) Date of Patent: Jul. 24, 2012

(54) CORELESS PACKAGING SUBSTRATE AND METHOD FOR FABRICATING THE SAME

(75) Inventor: Shih-Ping Hsu, Taoyuan (TW)

(73) Assignee: Unimicron Technology Corporation, Taoyuan (TW)

( * ) Notice: Subject to any disclaimer, the term of this patent is extended or adjusted under 35 U.S.C. 154(b) by 164 days.

(21) Appl. No.: 12/858,759

(22) Filed: Aug. 18, 2010

(65) Prior Publication Data
US 2011/0042128 A1 Feb. 24, 2011

(30) Foreign Application Priority Data
Aug. 18, 2009 (TW) .............................. 98127676 A

(51) Int. Cl.
*H05K 1/11* (2006.01)
(52) U.S. Cl. ........ 174/263; 174/262; 174/265; 438/637; 29/842
(58) Field of Classification Search .................. 174/250, 174/255, 257, 262–265; 438/637; 257/E21.576; 29/825, 829, 830, 831, 842
See application file for complete search history.

(56) References Cited

U.S. PATENT DOCUMENTS

| 7,640,655 | B2* | 1/2010 | Sunohara | 29/832 |
| 2007/0084630 | A1* | 4/2007 | Cho | 174/262 |
| 2007/0249154 | A1* | 10/2007 | Chen et al. | 438/618 |
| 2008/0296752 | A1* | 12/2008 | Nakajima | 257/697 |
| 2009/0145635 | A1* | 6/2009 | Shimizu | 174/255 |

* cited by examiner

*Primary Examiner* — Hoa C Nguyen
(74) *Attorney, Agent, or Firm* — Peter F. Corless; Steven M. Jensen; Edwards Wildman Palmer LLP

(57) ABSTRACT

A coreless packaging substrate includes: a substrate body including an auxiliary dielectric layer having opposing first and second surfaces, an inner wiring formed on the second surface, and a built-up structure formed on both the second surface of the auxiliary dielectric layer and the inner wiring; and a plurality of conductive bumps including metal pillars having opposing first and second ends and a solder layer formed on the first end, wherein the second ends of the metal pillars are disposed in the auxiliary dielectric layer and electrically connecting with the inner wiring, and the first ends of the metal pillars with the solder layer protrude from the first surface of the auxiliary dielectric layer, thereby achieving ultra-fine pitch and even-height conductive bumps. A method for fabricating the coreless packaging substrate as described above is further provided.

14 Claims, 6 Drawing Sheets

CORELESS PACKAGING SUBSTRATE AND METHOD FOR FABRICATING THE SAME

CROSS-REFERENCES TO RELATED APPLICATIONS

This application claims under 35 U.S.C. §119(a) the benefit of Taiwanese Application No. 098126767 filed Aug. 18, 2009 the entire contents of which is incorporated herein by reference.

BACKGROUND OF THE INVENTION

1. Field of the Invention

The present invention relates generally to coreless packaging substrates and methods for fabricating the same, and more particularly, to a coreless, ultra-fine pitch packaging substrate and a method for fabricating the same.

2. Description of Related Art

Along with the development of electronic industries, electronic products have a trend towards miniaturization and high performance, and accordingly multi-layer boards are developed so as to increase the layout area for the layout through interlayer connection techniques, and meet demands for high-density integrated circuits and meanwhile reduce the thickness of packaging substrates.

Conventionally, a multi-layer board comprises a core board and built-up structures disposed on two sides of the core board. However, the use of the core board increases the length of wires and thickness of the overall structure. Accordingly, coreless boards are developed to overcome these drawbacks, thereby meeting the developmental trend of high frequency and miniaturization.

FIGS. 1A to 1F shows a conventional packaging substrate and a method for fabricating the same.

Referring to FIG. 1A, a carrier board 10 is provided, and a thin metal layer 11, a releasing layer 12 and a carrier metal layer 13 are formed in sequence on the two surfaces of the carrier board 10.

Referring to FIG. 1B, a first dielectric layer 14 is formed on the carrier metal layer 13.

Referring to FIG. 1C, a plurality of vias 140 is formed in the first dielectric layer 14 by photolithography or laser ablation, and portions of the carrier metal layer 13 exposed from the vias 140 are etched away so as to form a plurality of concave portions 130.

Referring to FIG. 1D, a plurality of solder bumps 141a and first conductive vias 141b are formed in sequence in the concave portions 130 and the corresponding vias 140, and a first wiring layer 142 is formed on the first dielectric layer 14 and electrically connecting to the first conductive vias 141b; subsequently, a built-up structure 15 is formed on the first dielectric layer 14 and the first wiring layer 142, wherein the built-up structure 15 comprises at least a second dielectric layer 151, a second wiring layer 152 formed on the second dielectric layer 151, and a plurality of second conductive vias 153 formed in the second dielectric layer 151 and electrically connecting to the first wiring layer 142 and the second wiring layer 152, the outermost second wiring layer 152 of the built-up structure 15 comprising a plurality of conductive pads 154; furthermore, an insulating protective layer 16 is formed on the outermost layer of the built-up structure 15, and a plurality of openings 160 corresponding in position to the conductive pads 154 are formed in the insulating protective layer 16 so as for the conductive pads 154 to be exposed from the openings 160 formed in the insulating protective layer 16, respectively.

Referring to FIG. 1E, the releasing layer 12 is separated from the carrier metal layer 13 so as to form initial coreless packaging substrates that are separated from the carrier board 10.

Referring to FIG. 1F, the carrier metal layer 13 is removed such that the solder bumps 141a protrude from the first dielectric layer 14. Thus, a coreless packaging substrate is obtained, wherein the solder bumps 141a can be used for mounting a semiconductor chip (not shown) and the conductive pads 154 can be used for mounting a printed circuit board (not shown).

In the above-described method, since the carrier metal layer 13 is made of a metal material, the concave portions 130 can only be formed by etching. The etch-induced diameter and depth deviations make it difficult to control the volume and height deviation of the solder bumps 141a to be formed subsequently in the concave portions 130, thus leading to poor coplanarity of the solder bumps 141a. As a result, the joints between the semiconductor chip and the solder bumps may be damaged due to unbalanced stresses, or portions of the electrode pads of the semiconductor chip cannot form reliable joints with the corresponding solder bumps 141a due to insufficient height of the solder bumps 141a. In addition, if the average volume or height of the solder bumps 141a is relatively large, solder bridging (short circuit) may occur during reflow of the solder bumps 141a.

Therefore, it is imperative to overcome the above drawbacks of the prior art.

SUMMARY OF THE INVENTION

In view of the above drawbacks of the prior art, the present invention provides a coreless packaging substrate and a method for fabricating the same so as to achieve ultra-fine pitch and even-height conductive bumps.

In order to achieve the above and other objectives, the present invention provides a coreless packaging substrate, comprising: a substrate body comprising an auxiliary dielectric layer having a first surface and an opposing second surface, an inner wiring disposed on the second surface, and a built-up structure disposed on the second surface and the inner wiring, wherein the built-up structure comprises at least a dielectric layer, a wiring layer disposed on the dielectric layer, and a plurality of conductive vias disposed in the dielectric layer and electrically connecting to the wiring layer, portions of the conductive vias electrically connecting the wiring layer and the inner wiring, and the outermost wiring layer of the built-up structure comprises a plurality of conductive pads; and a plurality of conductive bumps comprising metal pillars each having a first end and an opposing second end and a solder layer formed on the first end, wherein the second ends of the metal pillars are disposed in the auxiliary dielectric layer to electrically connect to the inner wiring, and the first ends with the solder layer protrude from the first surface of the auxiliary dielectric layer.

The above-described packaging substrate further comprises an insulating protective layer disposed on the built-up structure and having a plurality of openings for exposing the conductive pads. The packaging substrate can further comprise a surface treatment layer disposed on the conductive pads, which is made of one selected from the group consisting of electroplated nickel/gold, electroplated silver, electroplated tin, Electroless Nickel and Immersion Gold (ENIG), Electroless Nickel/Electroless Palladium/Immersion Gold (ENEPIG), immersion tin, immersion gold, immersion silver, and organic solderability preservative (OSP).

The metal pillars can be made of copper.

The present invention further discloses a method for fabricating a coreless packaging substrate, comprises the steps of: providing a base material comprising a carrier layer having two opposing surfaces, a release film formed on the two opposing surfaces of the carrier layer, a metal layer formed on the release film, a first resist layer formed on the metal layer, and an auxiliary dielectric layer formed on the first resist layer, and defining an active region on the auxiliary dielectric layer; forming a plurality of openings in the auxiliary dielectric layer and the first resist layer so as to expose portions of the metal layer; sequentially forming a solder layer and metal pillars in the openings by electroplating; forming a second resist layer on the auxiliary dielectric layer and forming a plurality of open areas in the second resist layer by photolithography so as to expose portions of the auxiliary dielectric layer and expose the metal pillars; forming an inner wiring in the open areas by electroplating, the inner wiring electrically connecting to the metal pillars; removing the second resist layer; forming a built-up structure on the auxiliary dielectric layer and the inner wiring, wherein the built-up structure comprises at least a dielectric layer, a wiring layer formed on the dielectric layer, and a plurality of conductive vias formed in the dielectric layer and electrically connecting to the wiring layer and the inner wiring, the outermost wiring layer comprising a plurality of conductive pads; forming an insulating protective layer on the built-up structure, the insulating protective layer having a plurality of opening formed corresponding in position to the conductive pads so as to expose the conductive pads from the insulating protective layer; removing whatever outside the active region; removing the carrier layer and the release film so as to expose the metal layer, thereby forming two initial substrates; removing the metal layer such that the solder layer and the metal pillars in the openings of the first resist layer together form conductive bumps; and removing the first resist layer so as to form a coreless substrate body, wherein the substrate body comprises the auxiliary dielectric layer, the inner wiring and the built-up structure, the conductive bumps protruding from the auxiliary dielectric layer.

In the above-described method, the area of the carrier layer and the metal layer is greater than that of the release film, and the release film corresponds in position to the active region. The base material further comprises an adhesive layer formed in the regions between the carrier layer and the metal layer and outside the release film. The method further comprises removing the adhesive layer while removing whatever outside the active region.

The metal layer is made of a copper foil, the metal pillars are made of copper, and whatever outside the active region can be removed by cutting.

The method further comprises forming a surface treatment layer on the conductive pads, and the surface treatment layer is made of one selected from the group consisting of electroplated nickel/gold, electroplated silver, electroplated tin, Electroless Nickel and Immersion Gold (ENIG), Electroless Nickel/Electroless Palladium/Immersion Gold (ENEPIG), immersion tin, immersion gold, immersion silver, and organic solderability preservative (OSP).

Therefore, the present invention forms small aperture openings in the auxiliary dielectric layer and the first resist layer so as to efficiently control the average value and deviation of the volume and height of the conductive bumps formed in the openings, thereby achieving ultra-fine pitch bumps.

In particular, the conductive bumps of the present invention comprise the metal pillars with the solder layer formed on one end thereof, and the ends with the solder layer protrude from the first surface of the auxiliary dielectric layer. Since the metal pillars do not deform during the reflow process, there is no significant change on the average height of the conductive bumps and the height variation is low, thereby achieving preferred bump coplanarity and improving the joint reliability.

DETAILED DESCRIPTION OF PREFERRED EMBODIMENTS

The following illustrative embodiments are provided to illustrate the disclosure of the present invention, these and other advantages and effects can be apparent to those in the art after reading this specification.

FIGS. 2A to 2K are sectional views showing a coreless packaging substrate and a method for fabricating the same according to the present invention.

Figure 1A:
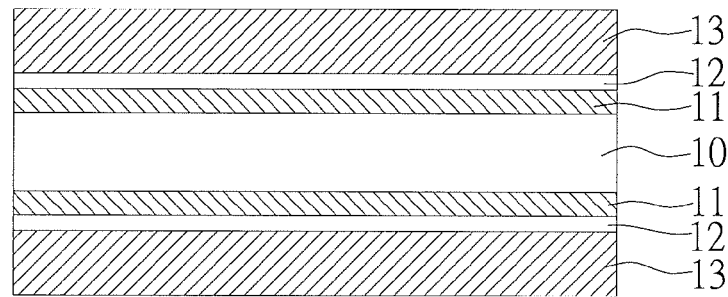
FIGS. 1A to 1F are sectional views showing a conventional coreless packaging substrate and a method for fabricating the same.
Figure 1B:
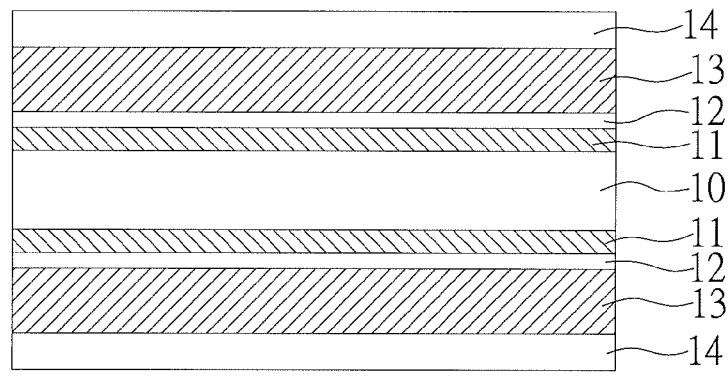
Figure 1C:
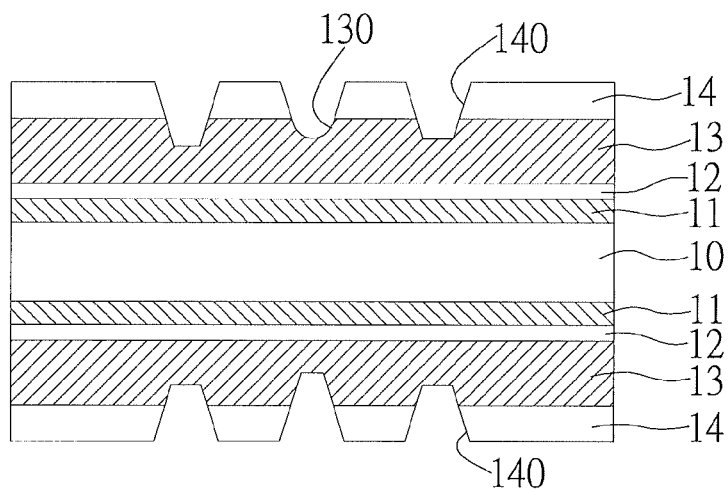
Figure 1D:
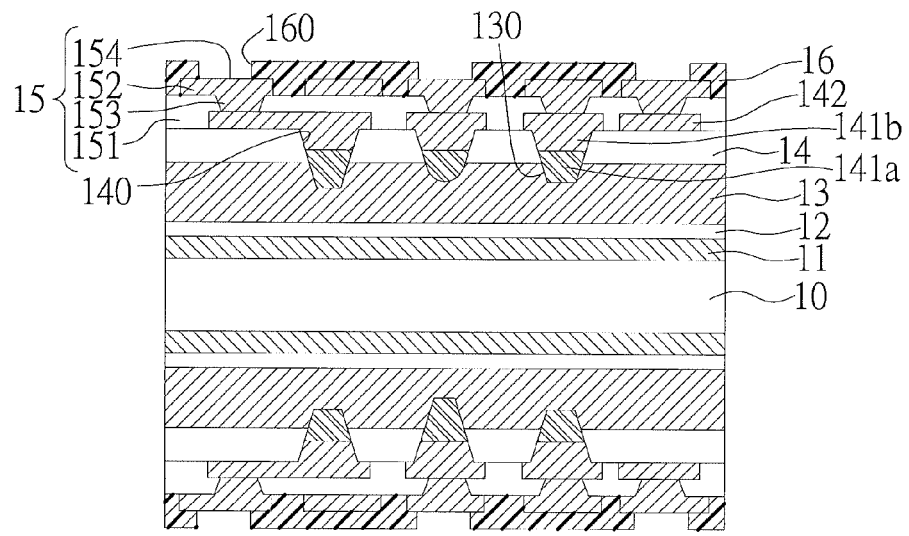
Figure 1E:
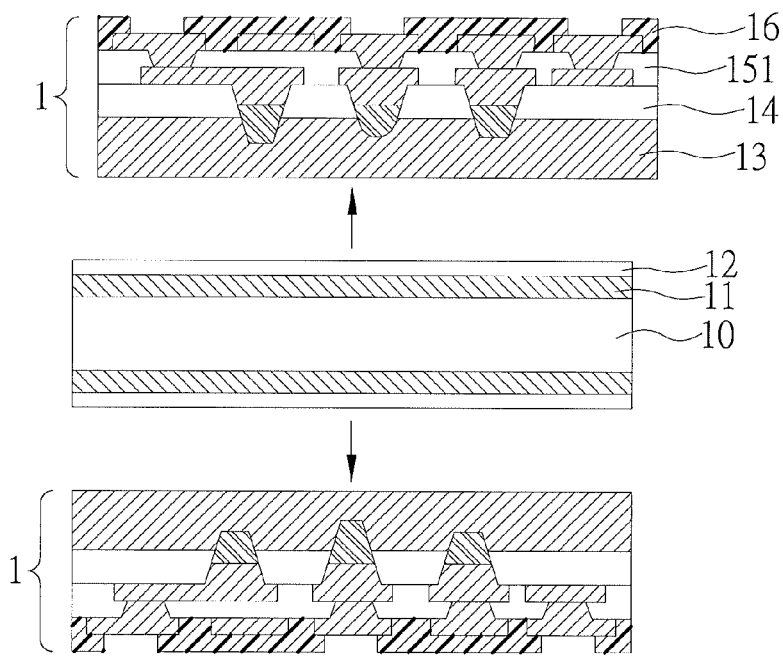
Figure 1F:
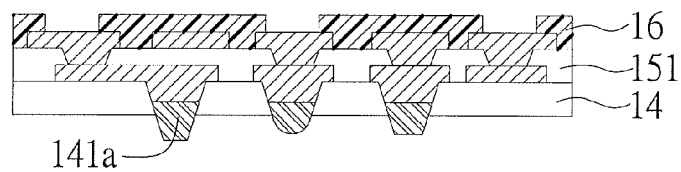
Figure 2A:
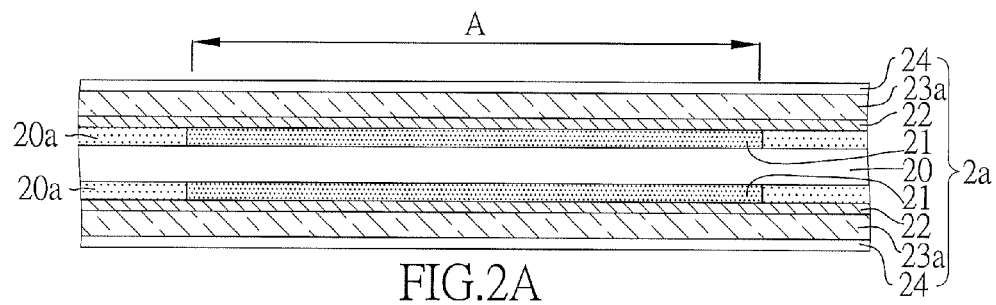
FIGS. 2A to 2K are sectional views showing a coreless packaging substrate and a method for fabricating the same according to the present invention.

Referring to FIG. 2A, a base material 2a is provided, which comprises a carrier layer 20 having two opposing surfaces, a release film 21 formed on portions of the two opposing surfaces of the carrier layer 20, an adhesive layer 20a formed on the two opposing surfaces of the carrier layer 20 outside the release film 21, a metal layer 22 formed on the release film 21 and the adhesive layer 20a, a first resist layer 23a formed on the metal layer 22, and an auxiliary dielectric layer 24 formed on the first resist layer 23a, wherein an active region A is defined on the auxiliary dielectric layer 24, the carrier layer 20 and the metal layer 22 have an area greater than that of the release film 21, and the release film 21 corresponds in position to the active region A such that the adhesive layer is formed between the carrier layer 20 and the metal layer 22 and outside the release film 21. In addition, the metal layer 22 is made of a copper foil, and the release film 21 is made of a metal material, an acrylic material, a plastic material or a peelable adhesive material.

The ensuing process steps are performed on both sides of the carrier layer 20. Hence, the following description is exemplified by either side of the carrier layer 20.

Figure 2B:
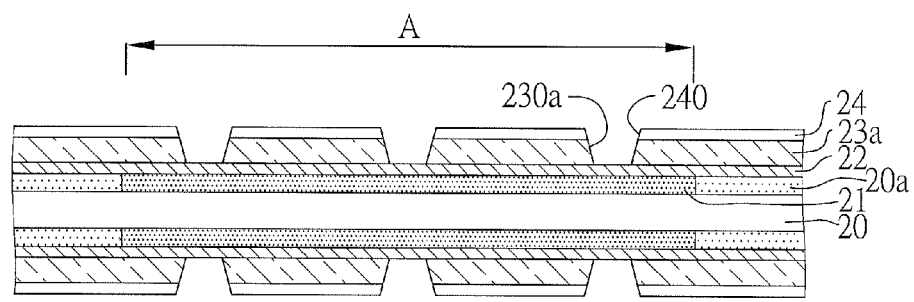

Referring to FIG. 2B, a plurality of openings 240 are formed in the auxiliary dielectric layer 24 and the first resist layer 23a so as to expose portions of the metal layer 22. The openings 240 can be formed by photolithography, laser ablation or plasma. Porous structures can be first formed on the auxiliary dielectric layer 24, and then vias 230a are formed in first resist layer 23a corresponding in position to the porous structures to communicate with the porous structures so as to form the openings 240, or the openings 240 can be formed to penetrate the auxiliary dielectric layers 24 and the first resist layer 23a at the same time. The first resist layer 23a can be made of a photo-resist material or a photo-sensitive resin material, and the auxiliary dielectric layer 24 can be made of a dielectric material.

Figure 2C:
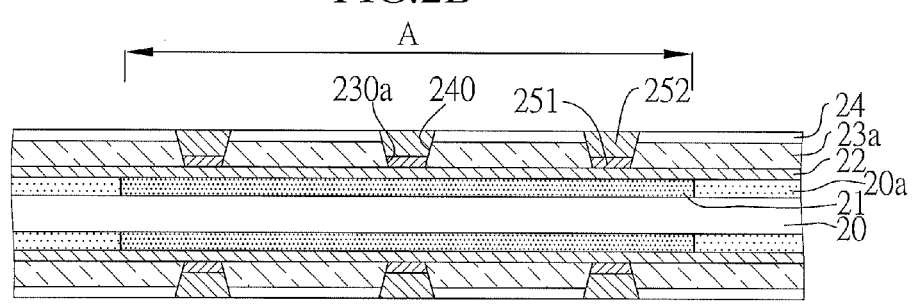

Referring to FIG. 2C, a solder layer 251 and a metal pillar 252 are sequentially formed by electroplating in the openings 240, respectively, wherein the metal pillars 252 are made of copper.

Figure 2D:
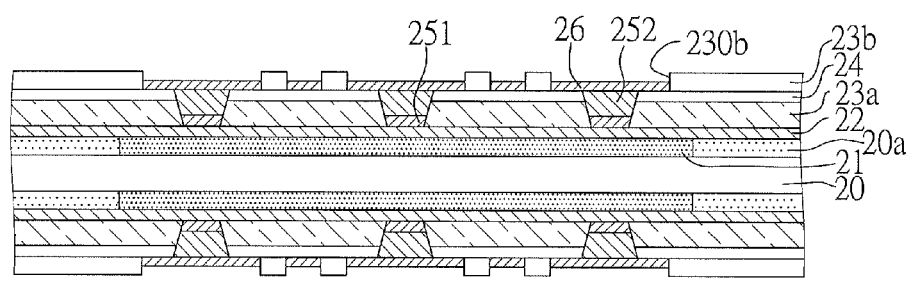

Referring to FIG. 2D, a second resist layer 23b is formed on the auxiliary dielectric layer 24 and a plurality of open areas 230b are formed in the second resist layer 23b by photolithography so as to expose portions of the auxiliary dielectric layer 24 and expose the metal pillars 252; and then, an inner wiring 26 is formed by performing an electroplating process on the auxiliary dielectric layer 24 and the metal pillars 252 in the open areas 230b so as for the inner wiring 26 to be electrically connected to the metal pillars 252.

Figure 2E:
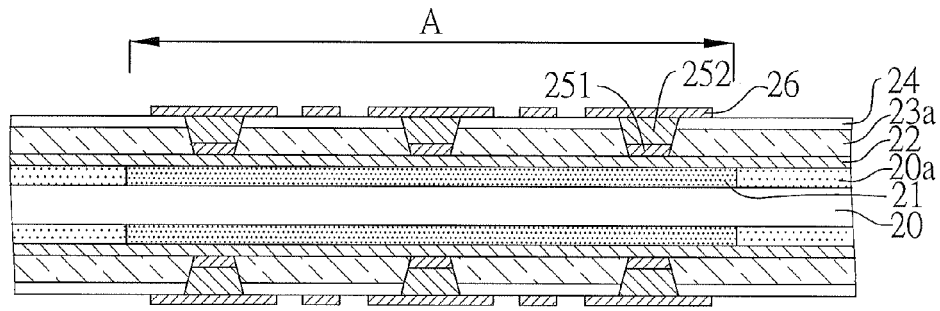

Referring to FIG. 2E, the second resist layer 23b is removed to expose the auxiliary dielectric layer 24 and the inner wiring 26.

Figure 2F:
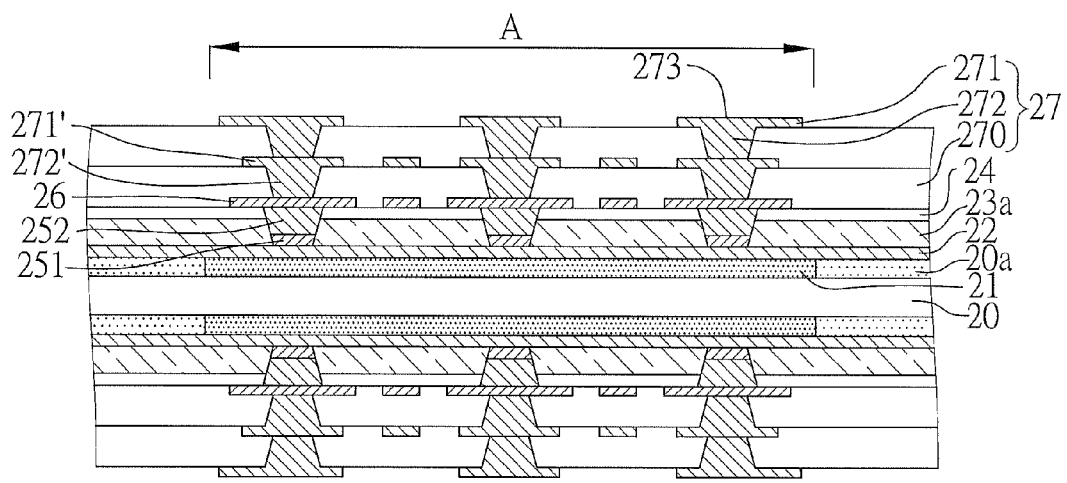

Referring to FIG. 2F, a built-up structure 27 is formed on the auxiliary dielectric layer 24 and the inner wiring 26. The built-up structure 27 comprises at least a dielectric layer 270, a wiring layer 271 formed on the dielectric layer 270, and a plurality of conductive vias 272 formed in the dielectric layer 270 to electrically connect to the wiring layer 271. Portions of the conductive vias 272' electrically connect the wiring layer 271' and the inner wiring 26. The outmost wiring layer 271 has a plurality of conductive pads 273 for mounting a printed circuit board (not shown).

Figure 2G:
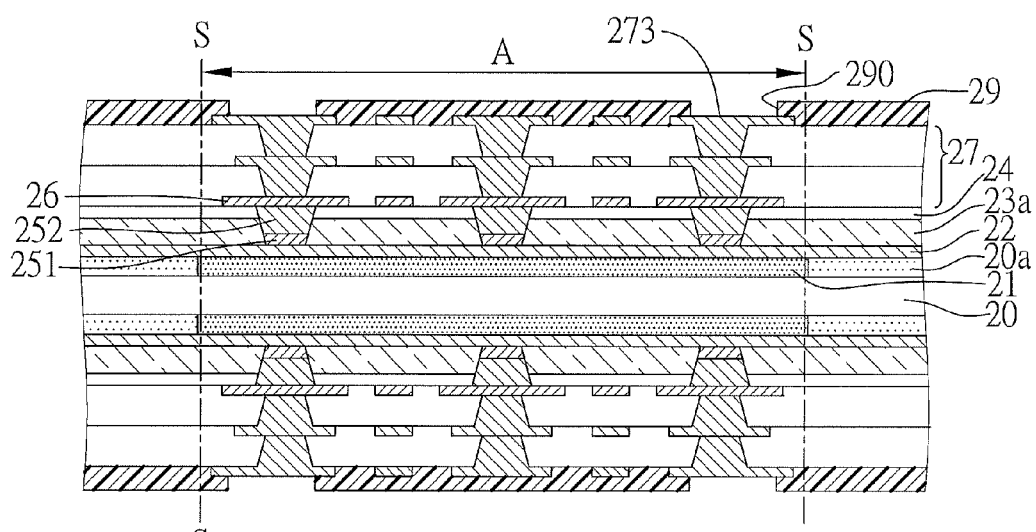

Referring to FIG. 2G an insulating protective layer 29 is formed on the built-up structure 27, and a plurality of openings 290 corresponding in position to the conductive pads 273 are formed in the insulating protective layer 29 so as for the conductive pads 273 to be exposed from the openings 290 formed in the insulating protective layer 29, respectively. The insulating protective layer 29 may be made of green paint, a photosensitive or non-photosensitive dielectric material or resin material.

Figure 2H:
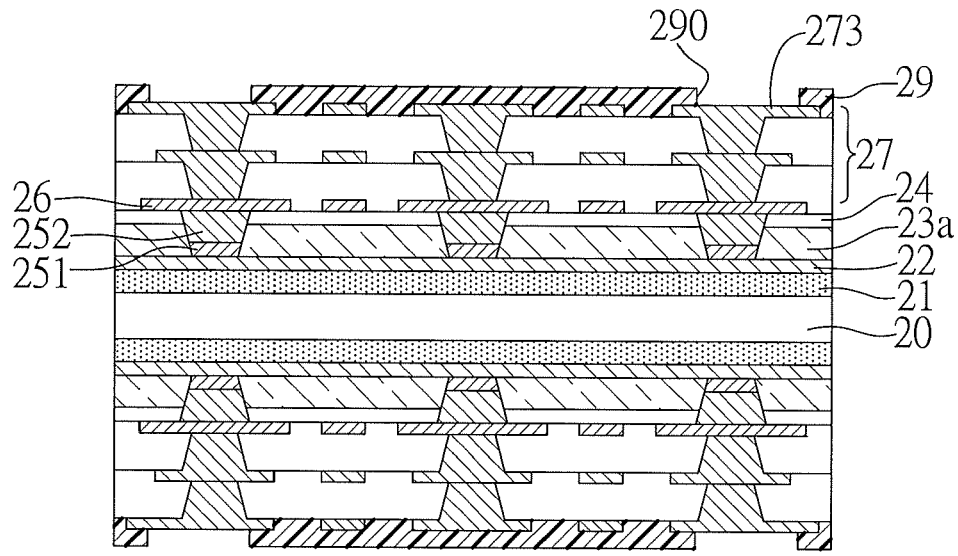

Referring to FIG. 2H, the structure is cut along a cutting line S-S (as shown in FIG. 2G) so as to remove the portions out of the active region A and the adhesive layer 20a. Since the overall coreless packaging substrate can comprise a plurality of coreless packaging substrate units, through the cutting process, the plurality of coreless packaging substrate units can be separated from each other so as to obtain a plurality of single coreless units.

Figure 2I:
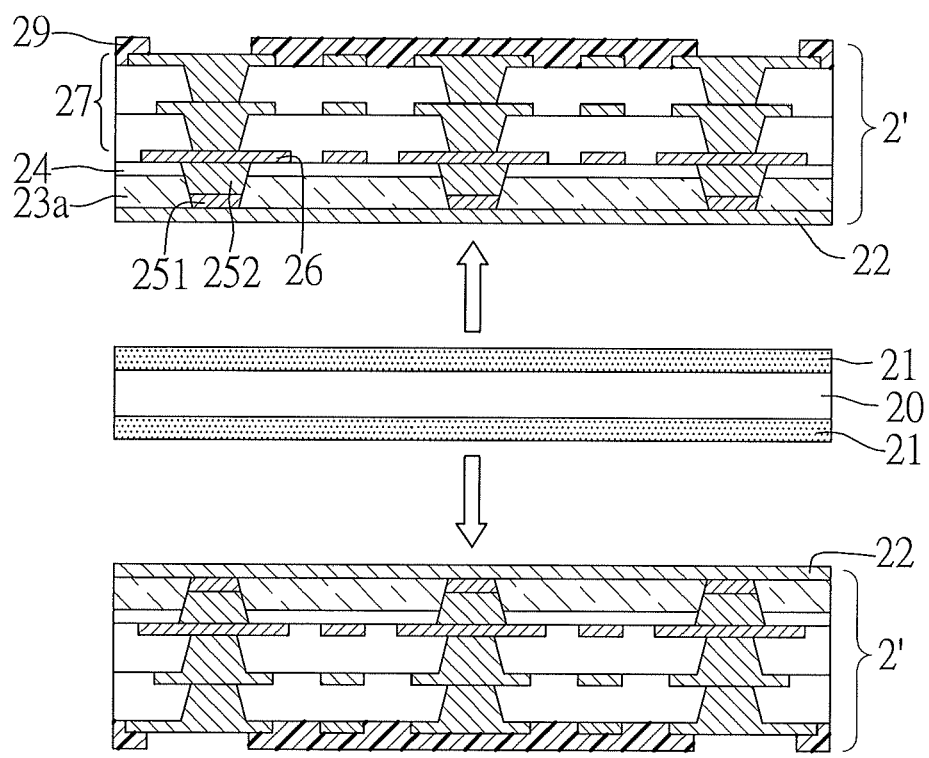

Referring to FIG. 2I, the carrier layer 20 and the release film 21 are removed to expose the metal layer 22, thereby forming two coreless initial substrate 2'.

Figure 2J:
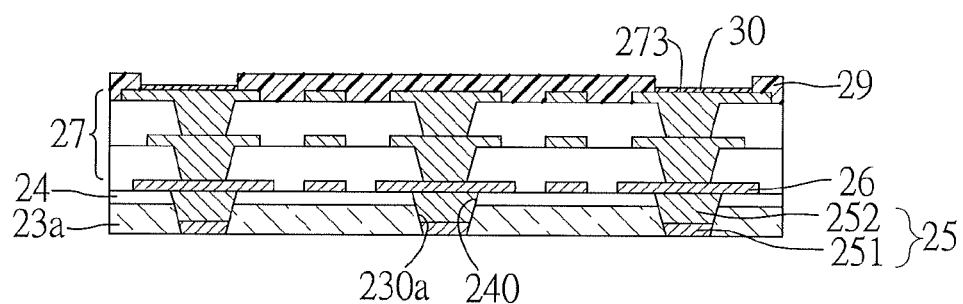

Referring to FIG. 2J, the metal layer 22 is removed such that the solder layer 251 and the metal pillars 252 in the openings 240 together form a plurality of conductive bumps 25. Further, a surface treatment layer 30 is formed on the conductive pads 273.

Figure 2K:
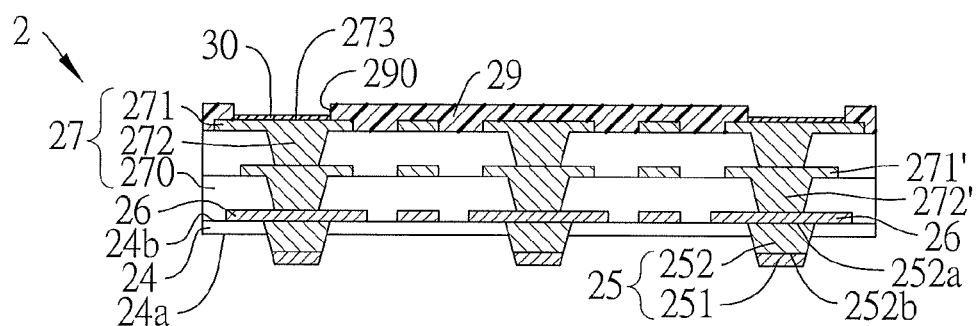

Referring to FIG. 2K, the first resist layer 23a is removed so as to form a coreless substrate body 2 comprising the auxiliary dielectric layer 24, the inner wiring 26 and the built-up structure 27. Meanwhile, the conductive bumps 25 protrude from the auxiliary dielectric layer 24. Thus, the fabrication process of a coreless packaging substrate is completed.

According to the present invention, the openings 240 are formed to penetrate the first resist layer 23a and the auxiliary dielectric layer 24. Since the first resist layer 23a is a dry film, small aperture vias 230a can be formed in the first resist layer 23a by laser ablation, plasma or photolithography so as to efficiently control the average value and deviation of the volume and height of the conductive bumps 25 formed in the openings 240, thereby meeting the demand of fine pitch.

In particular, the conductive bumps 25 comprise the metal pillars 252 and the solder layer 251 formed on one end thereof. The metal pillars 252 and the solder layer 251 protrude from the auxiliary dielectric layer 24, and the solder layer 251 occupies a small volume of the conductive bumps 25. Since the metal pillars 252 does not deform during the reflow process, there is no significant change in the average height of the conductive bumps 25 and the height variation thereof is low, thereby achieving preferred bump coplanarity, preventing solder bridging and improving the joint reliability.

The present invention further discloses a coreless packaging substrate, which comprises a substrate body 2 and a plurality of conductive bumps 25.

The substrate body 2 comprises an auxiliary dielectric layer 24 having a first surface 24a and an opposing second surface 24b, an inner wiring 26 formed on the second surface 24b, a built-up structure 27 formed on the second surface 24b and the inner wiring 26, wherein the built-up structure 27 comprises at least a dielectric layer 270, a wiring layer 271 formed on the dielectric layer 270, and a plurality of conductive vias 272 formed in the dielectric layer 270 and electrically connecting to the wiring layer 271, portions of the conductive vias 272' electrically connecting to the wiring layer 271' and the inner wiring 26 and the outermost wiring layer 71 having a plurality of conductive pads 273 for mounting a printed circuit board (not shown).

The conductive bumps 25 comprise metal pillars 252 having a first end 252a and an opposing second end 252b and a solder layer 251 formed on the first end 252a of the metal pillars 252. The second ends 252b of the metal pillars 252 are located in the auxiliary dielectric layer 24 and electrically connecting to the inner wiring 26. The first ends 252a of the metal pillars 252 with the solder layer 251 protrude from the first surface 24a of the auxiliary dielectric layer 24.

The coreless packaging substrate further comprises an insulating protective layer 29 and a surface treatment layer 30, wherein the insulating protective layer 29 is formed on the built-up structure 27 and formed therein with a plurality of openings 290 for exposing the conductive pads 273, respectively. The surface treatment layer 30 is formed on the exposed surfaces of the conductive pads 273. The surface treatment layer 30 can be made of one selected from the group consisting of electroplated nickel/gold, electroplated silver, electroplated tin, Electroless Nickel and Immersion Gold (ENIG), Electroless Nickel/Electroless Palladium/Immersion Gold (ENEPIG), immersion tin, immersion gold, immersion silver, and organic solderability preservative (OSP).

The above-described descriptions of the detailed embodiments are only to illustrate the preferred implementation according to the present invention, and it is not to limit the scope of the present invention, Accordingly, all modifications and variations completed by those with ordinary skill in the art should fall within the scope of present invention defined by the appended claims.

What is claimed is:

1. A coreless packaging substrate, comprising:
   a substrate body comprising an auxiliary dielectric layer having a first surface and an opposing second surface, an inner wiring disposed on the second surface, and a built-up structure disposed on the second surface and the inner wiring, wherein the built-up structure comprises at least a dielectric layer, a wiring layer disposed on the dielectric layer, and a plurality of conductive vias formed in the dielectric layer to electrically connect to the wiring layer, a portion of the conductive vias electrically connect the wiring layer and the inner wiring, and the outmost wiring layer of the built-up structure has a plurality of conductive pads; and
   a plurality of conductive bumps comprising metal pillars each having a first end and an opposing second end and a solder layer formed on the first end, wherein the second ends of the metal pillars are disposed in the auxiliary dielectric layer to electrically connect to the inner wiring, and the first ends of the metal pillars and the solder layer protrude from the first surface of the auxiliary dielectric layer.

2. The substrate of claim 1, further comprising an insulating protective layer disposed on the built-up structure and having a plurality of openings for exposing the conductive pads, respectively.

3. The substrate of claim 2, further comprising a surface treatment layer disposed on the conductive pads.

4. The substrate of claim 3, wherein the surface treatment layer is made of one selected from the group consisting of electroplated nickel/gold, electroplated silver, electroplated tin, Electroless Nickel and Immersion Gold (ENIG), Electroless Nickel/Electroless Palladium/Immersion Gold (ENEPIG), immersion tin, immersion gold, immersion silver, and organic solderability preservative (OSP).

5. The substrate of claim 1, wherein the metal pillars are made of copper.

6. A method for fabricating a coreless packaging substrate, comprising the steps of:
providing a base material comprising a carrier layer having two opposing surfaces, a release film formed on the two opposing surfaces of the carrier layer, a metal layer formed on the release film, a first resist layer formed on the metal layer, and an auxiliary dielectric layer formed on the first resist layer, and defining an active region on the auxiliary dielectric layer;
forming a plurality of openings in the auxiliary dielectric layer and the first resist layer so as for a portion of the metal layer to be exposed from the openings, respectively;
forming a solder layer and metal pillars sequentially in the openings by electroplating;
forming a second resist layer on the auxiliary dielectric layer and forming a plurality of open areas in the second resist layer by photolithography so as to expose a portion of the auxiliary dielectric layer and the metal pillars;
forming an inner wiring in the open areas by electroplating, the inner wiring being electrically connected to the metal pillars;
removing the second resist layer;
forming a built-up structure on the auxiliary dielectric layer and the inner wiring, wherein the built-up structure comprises at least a dielectric layer, a wiring layer formed on the dielectric layer, and a plurality of conductive vias formed in the dielectric layer and electrically connecting the wiring layer and the inner wiring, the outmost wiring layer has a plurality of conductive pads;
forming an insulating protective layer on the built-up structure, the insulating protective layer having a plurality of openings formed therein so as for the conductive pads to be exposed from the openings formed in the insulating protective layer, respectively;
removing whatever outside the active region;
removing the carrier layer and the release film so as to expose the metal layer, thereby forming two initial substrates;
removing the metal layer such that the solder layer and the metal pillars in the openings of the first resist layer together form conductive bumps; and
removing the first resist layer so as to form a coreless substrate body, wherein the substrate body comprises the auxiliary dielectric layer, the inner wiring and the built-up structure, the conductive bumps being protruding from the auxiliary dielectric layer.

7. The method of claim 6, wherein an area of the carrier layer and the metal layer is greater than that of the release film, and the release film corresponds in position to the active region.

8. The method of claim 7, wherein the base material comprises an adhesive layer formed in the regions between the carrier layer and the metal layer and outside the release film.

9. The method of claim 8, further comprising removing the adhesive layer while removing whatever outside the active region.

10. The method of claim 6, wherein the metal layer is made of a copper foil.

11. The method of claim 6, wherein the metal pillars are made of copper.

12. The method of claim 6, wherein whatever outside the active region is removed by cutting.

13. The method of claim 6, further comprising forming a surface treatment layer on the conductive pads.

14. The method of claim 13, wherein the surface treatment layer is made of one selected from the group consisting of electroplated nickel/gold, electroplated silver, electroplated tin, Electroless Nickel and Immersion Gold (ENIG), Electroless Nickel/Electroless Palladium/Immersion Gold (ENEPIG), immersion tin, immersion gold, immersion silver, and organic solderability preservative (OSP).

* * * * *